United States Patent
Supino et al.

(10) Patent No.: US 8,887,550 B2
(45) Date of Patent: Nov. 18, 2014

(54) TWO DEGREE OF FREEDOM DITHERING PLATFORM FOR MEMS SENSOR CALIBRATION

(75) Inventors: Ryan Supino, Loretto, MN (US); Eugen Cabuz, Eden Prairie, MN (US); Burgess R. Johnson, Bloomington, MN (US); Robert D. Horning, Savage, MN (US)

(73) Assignee: Honeywell International Inc., Morristown, NJ (US)

( * ) Notice: Subject to any disclaimer, the term of this patent is extended or adjusted under 35 U.S.C. 154(b) by 254 days.

(21) Appl. No.: 13/345,132

(22) Filed: Jan. 6, 2012

(65) Prior Publication Data

US 2012/0272731 A1   Nov. 1, 2012

Related U.S. Application Data

(60) Provisional application No. 61/479,783, filed on Apr. 27, 2011.

(51) Int. Cl.
  *G01P 21/00* (2006.01)
  *G01D 5/34* (2006.01)

(52) U.S. Cl.
  CPC ........................................ *G01D 5/34* (2013.01)
  USPC .......................................................... 73/1.37

(58) Field of Classification Search
  CPC ............................ G01C 19/5783; G01P 21/00
  USPC ............................ 73/1.37, 1.38, 1.77, 504.12
  See application file for complete search history.

(56) References Cited

U.S. PATENT DOCUMENTS

| | | | |
|---|---|---|---|
| 6,311,555 B1 | 11/2001 | McCall et al. | |
| 6,508,122 B1 | 1/2003 | McCall et al. | |
| 7,219,548 B2 | 5/2007 | Wyse | |
| 7,250,112 B2 | 7/2007 | Nasiri et al. | |
| 7,481,109 B2 | 1/2009 | Moore et al. | |
| 7,621,183 B2 | 11/2009 | Seeger et al. | |
| 7,640,803 B1 | 1/2010 | Gutierrez | |
| 8,256,290 B2 * | 9/2012 | Mao | 73/504.12 |
| 8,336,380 B2 * | 12/2012 | Kandori et al. | 73/504.12 |
| 2006/0196269 A1 | 9/2006 | Jaffe | |
| 2011/0030474 A1 | 2/2011 | Kuang et al. | |

OTHER PUBLICATIONS

Goyal et al., "High Speed Anisotropic etching of Pyrex for Microsystems Applications", "Journal of Non-Crystalline Solids", Mar. 7, 2006, pp. 657-663, Publisher: Department of Electrical Engineering, Pennsylvania State University.

(Continued)

*Primary Examiner* — John Chapman, Jr.
(74) *Attorney, Agent, or Firm* — Fogg & Powers

(57) ABSTRACT

Systems and methods for two degree of freedom dithering for micro-electro-mechanical system (MEMS) sensor calibration are provided. In one embodiment, a method for a device comprises forming a MEMS sensor layer, the MEMS sensor layer comprising a MEMS sensor and an in-plane rotator to rotate the MEMS sensor in the plane of the MEMS sensor layer. Further, the method comprises forming a first and second rotor layer and bonding the first rotor layer to a top surface and the second rotor layer to the bottom surface of the MEMS sensor layer, such that a first and second rotor portion of the first and second rotor layers connect to the MEMS sensor. Also, the method comprises separating the first and second rotor portions from the first and second rotor layers, wherein the first and second rotor portions and the MEMS sensor rotate about an in-plane axis of the MEMS sensor layer.

12 Claims, 7 Drawing Sheets

(56) References Cited

OTHER PUBLICATIONS

Li Li et al., "Smooth Surface Glass Etching by Deep Reactive ion Etching with SF6 and Xe gases", Nov. 25, 2003, pp. 2545-2549, Publisher: American Vacuum Society.

Mark et al, "A Resolution Enhancement Technique for Laser Gyros", "downloaded from http://www.es.northropgrumman.com/media/whitepapers/assets/Resolution_Enhancement_Techniq.pdf on Sep. 22, 2011", May 26, 1997, pp. 1-14.

Xinghua Li et al., "Deep Reactive Etching of Pyrex Glass", 2000, pp. 271-276, Publisher: Graduate School of Engineering, Tohoku University.

Yamakawa et al., "Ultrahigh-speed etching of SiO2 with ultrahigh selectivity over Si in microwave-excited non equilibrium atmospheric pres", "Applied Physics Letters", Jul. 26, 2004, pp. 549-551, vol. 85, No. 4, Publisher: AIP.

\* cited by examiner

TWO DEGREE OF FREEDOM DITHERING PLATFORM FOR MEMS SENSOR CALIBRATION

This application claims the benefit of U.S. Provisional Application No. 61/479,783, filed on Apr. 27, 2011, which is incorporated herein by reference in its entirety.

BACKGROUND

The performance of some inertial sensors drift over time. Frequently, performance drifts in MEMS sensors arise due to the interplay between electronic and mechanical components. The electronics of a MEMS inertial sensor drift over time because they provide an analog output that is inherently subject to long term drift. Also, the mechanics of MEMS type inertial sensors cause performance drifts in response to package stresses, thermal expansions, and other mechanical factors. These performance drifts change both the bias and scale factor of the output from the inertial sensor.

SUMMARY

The embodiments of the present disclosure provide systems and methods for a two degree of freedom dithering platform for MEMS sensor calibration and will be understood by reading and studying the following specification.

Systems and methods for two degree of freedom dithering for micro-electromechanical system (MEMS) sensor calibration are provided. In one embodiment, a method for a device comprises forming a MEMS sensor layer, the MEMS sensor layer comprising a MEMS sensor and an in-plane rotator to rotate the MEMS sensor in the plane of the MEMS sensor layer. Further, the method comprises forming a first and second rotor layer and bonding the first rotor layer to a top surface and the second rotor layer to the bottom surface of the MEMS sensor layer, such that a first and second rotor portion of the first and second rotor layers connect to the MEMS sensor. Also, the method comprises separating the first and second rotor portions from the first and second rotor layers, wherein the first and second rotor portions and the MEMS sensor rotate about an in-plane axis of the MEMS sensor layer.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1A:
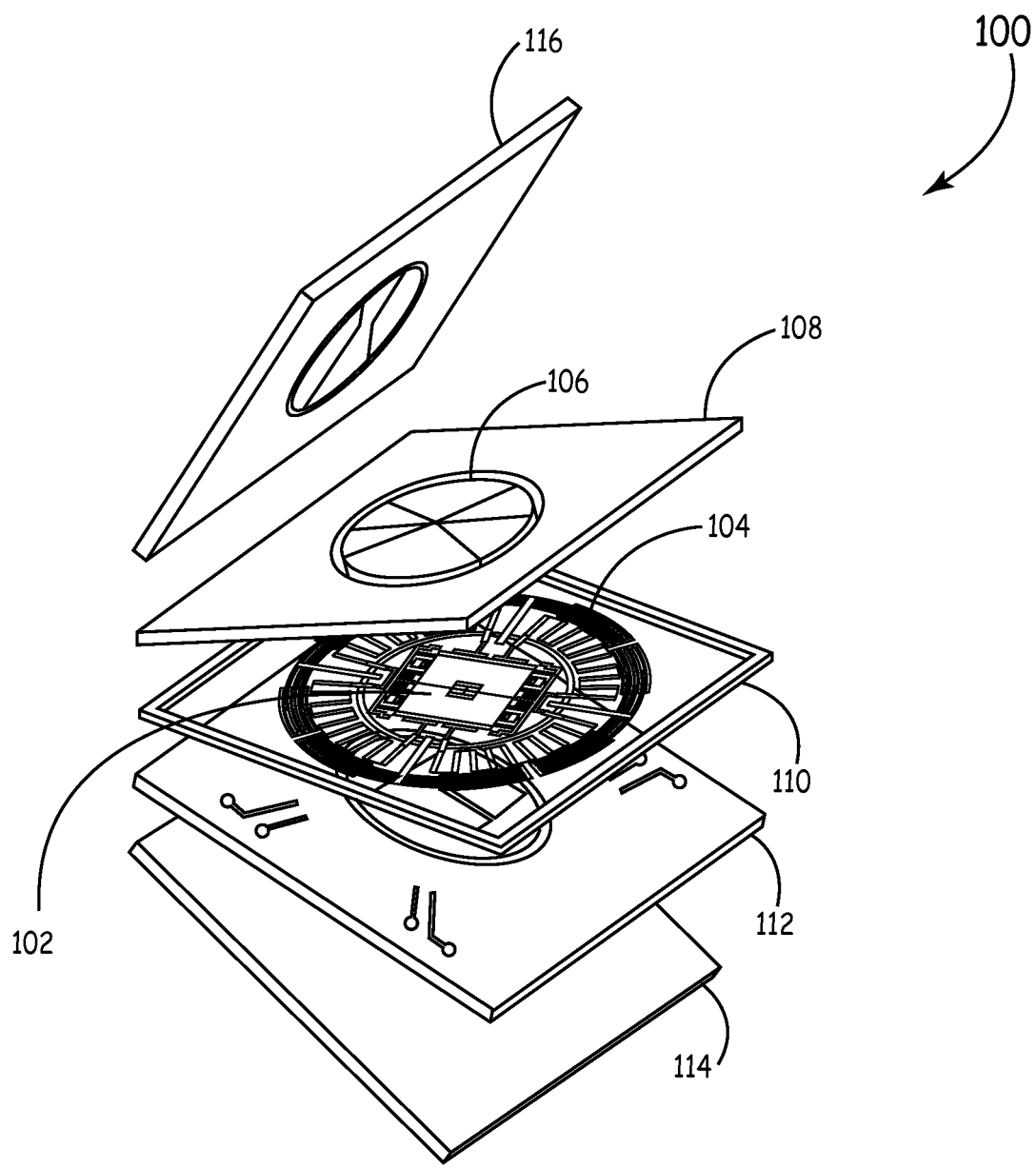
FIG. 1A is an exploded perspective view of one embodiment of a MEMS sensor in accordance with the present invention.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below relate to a two degree of freedom dithering platform for a MEMS inertial sensor. The dithering platform oscillates the position of a MEMS sensor about two axes. The dithering allows for the correction of a bias and scale factor drift that occurs over time.

FIG. 1A is an exploded perspective view of one embodiment of a MEMS sensing device 100. MEMS sensing device 100 includes a MEMS sensor 102. In certain embodiments, MEMS sensor 102 functions as a gyroscope and senses rotation about an input axis. Alternatively, MEMS sensor 102 is an accelerometer that senses acceleration along an axis. Further, MEMS sensor 102 includes multiple gyroscopes, accelerometers, and combinations thereof. In certain embodiments, electrical and mechanical factors cause the bias and scale factor of MEMS sensor 102 to drift over time. To calibrate MEMS sensor 102 and correct the bias and scale factor drift, MEMS sensing device 100 includes an in-plane rotator 104 and an out-of-plane rotator 106. In-plane rotator 104 is a device that dithers the MEMS sensor 102 about an axis that runs through MEMS sensor 102 and is perpendicular to MEMS sensor layer 110 to correct the bias drift. In certain embodiments, in-plane rotator 104 rotationally oscillates MEMS sensor 102 in the plane of MEMS sensor layer 110. When in-plane rotator 104 oscillates MEMS sensor 102, in-plane rotator 104 oscillates MEMS sensor 102 up to an angular distance from a non-oscillating position. For example, in at least one exemplary implementation, in-plane rotator 104 rotates MEMS sensor 102 up to 12 degrees from a non-oscillating position. In at least one embodiment, in-plane-rotator 104 is formed as part of MEMS sensor layer 110.

To correct the scale factor drift, MEMS sensing device 100 includes an out-of-plane rotator 106. Out-of-plane rotator 106 rotates MEMS sensor 102 about an axis in the plane of MEMS sensor 102 that extends through MEMS sensor 102, such that the edges of MEMS sensor 102 oscillate in and out of the plane containing MEMS sensor 102. In at least one exemplary implementation, out-of-plane rotator 106 rotates MEMS sensor 102 less than one degree about an axis in the plane of MEMS sensor 102.

In certain embodiments, out-of-plane rotator 106 is formed as a series of layers that are bonded to MEMS sensor layer 110. For example, out-of-plane rotator 106 includes first rotor layer 108, second rotor layer 112, first rotor controlling layer 116, and second rotor controlling layer 114. The first rotor layer 108 and second rotor layer 112 join to MEMS sensor layer 110. When first rotor layer 108 and second rotor layer 112 are joined to MEMS sensor layer 110, a first rotor portion of first rotor layer 108 and a second rotor portion of second rotor layer 112 join to MEMS sensor 102. The combination of first rotor portion and second rotor portion about MEMS sensor 102 form a rotor that is dithered by in-plane rotator 104 and out-of-plane rotator 106. To control the out-of-plane rotation, first rotor controlling layer 116 and second rotor controlling layer 114 contain electrodes that control the out-of-plane motion of first and second rotor portions. By dithering MEMS sensor 102 in and out of the plane formed by MEMS sensor layer 110, out-of-plane rotator 106 corrects scale factor drift that occurs over time. Further, the first rotor portion of first rotor layer 108 and the second rotor portion of second rotor layer 112 include capacitive pickoff plates that sense the motion of the gyroscopes.

Figure 1B:
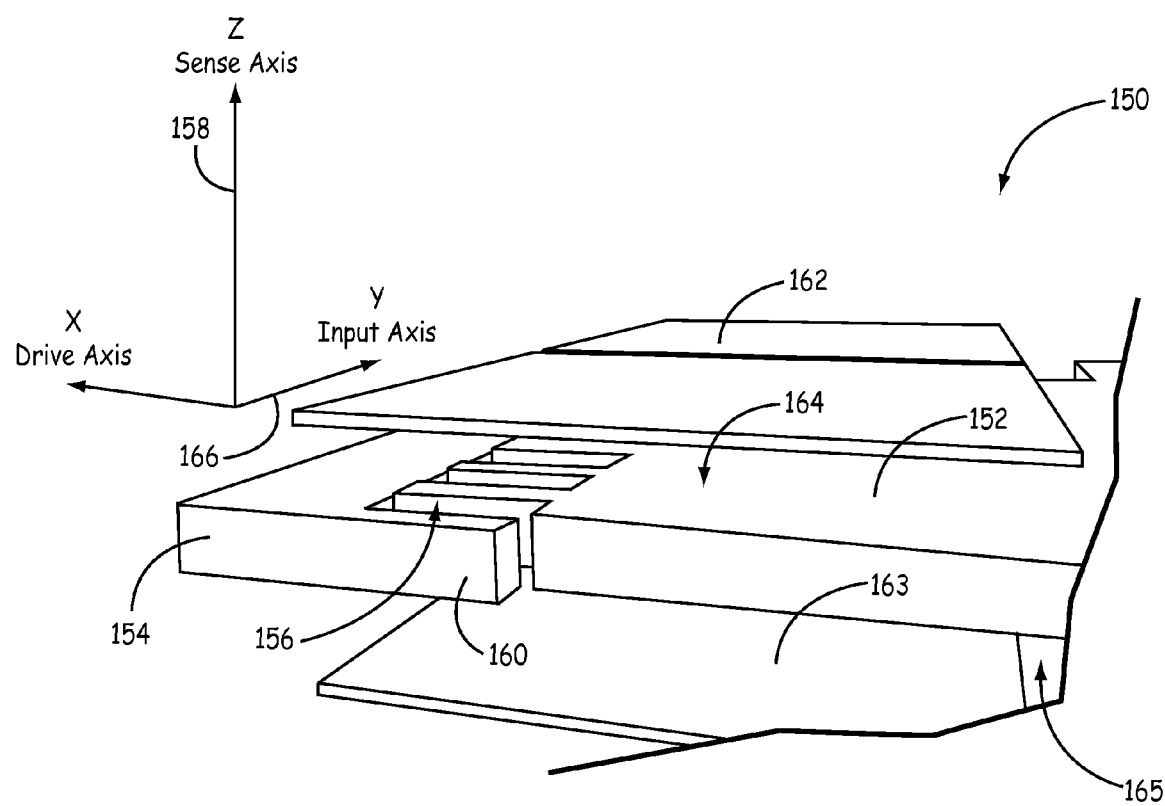
FIG. 1B is a perspective view of an example of a vibratory structure gyroscope implemented as an embodiment of the MEMS sensor in FIG. 1A.

FIG. 1B is a perspective view of an example of a vibratory structure gyroscope 150 implemented as MEMS sensor 102 in FIG. 1A. In at least one embodiment, gyroscope 150 includes at least one proof mass 152 (also referred to herein simply as "proof mass 152") that is configured to move according to a Coriolis Effect. Gyroscope 150 also includes at least one drive electrode 154 (also referred to herein simply as "drive electrode 154") configured to apply a drive signal to proof mass 152. In certain implementations, proof mass 152 comprises a generally planar structure having at least one comb 156 (also referred to herein as "proof mass comb 156") on one or more edges of the planar structure. In an example, the proof mass 152 is configured such that a Coriolis Effect moves proof mass 152 in a direction normal to the planar structure; that is, a sense axis 158 of the proof mass 152 is normal to the planar structure.

In certain embodiments, the drive electrode 154 also includes at least one comb 160 (also referred to herein as "drive comb 160") that is configured to engage with the proof mass 152 and is configured to apply a drive signal to the proof mass comb 156. In an example, the at least one comb 156 of the proof mass 152 can include a first comb and a second comb, and the at least one comb 160 can include a third comb and a fourth comb. The third comb can be configured to engage with and apply a drive signal to the first comb and the fourth comb can be configured to engage with and apply a drive signal to the second comb.

In at least one exemplary embodiment, gyroscope 150 includes a first sense electrode 162 and a second sense electrode 163 that are configured to sense movement of the proof mass 152 along the sense axis 158. In order to sense movement along the sense axis 158, the proof mass 152 can be disposed between the sense electrodes 162, 163, such that the sense electrodes 162, 163 are disposed opposing respective planar sides 164, 165 of the proof mass 152. The sense electrodes 162, 163, therefore, can sense movement of the proof mass 152 along the sense axis 158 by sensing a change in the distance between the proof mass 152 and the sense electrodes 162, 163. This change in distance can be sensed by a change in capacitance between the sense electrodes 162, 163.

Figure 2:
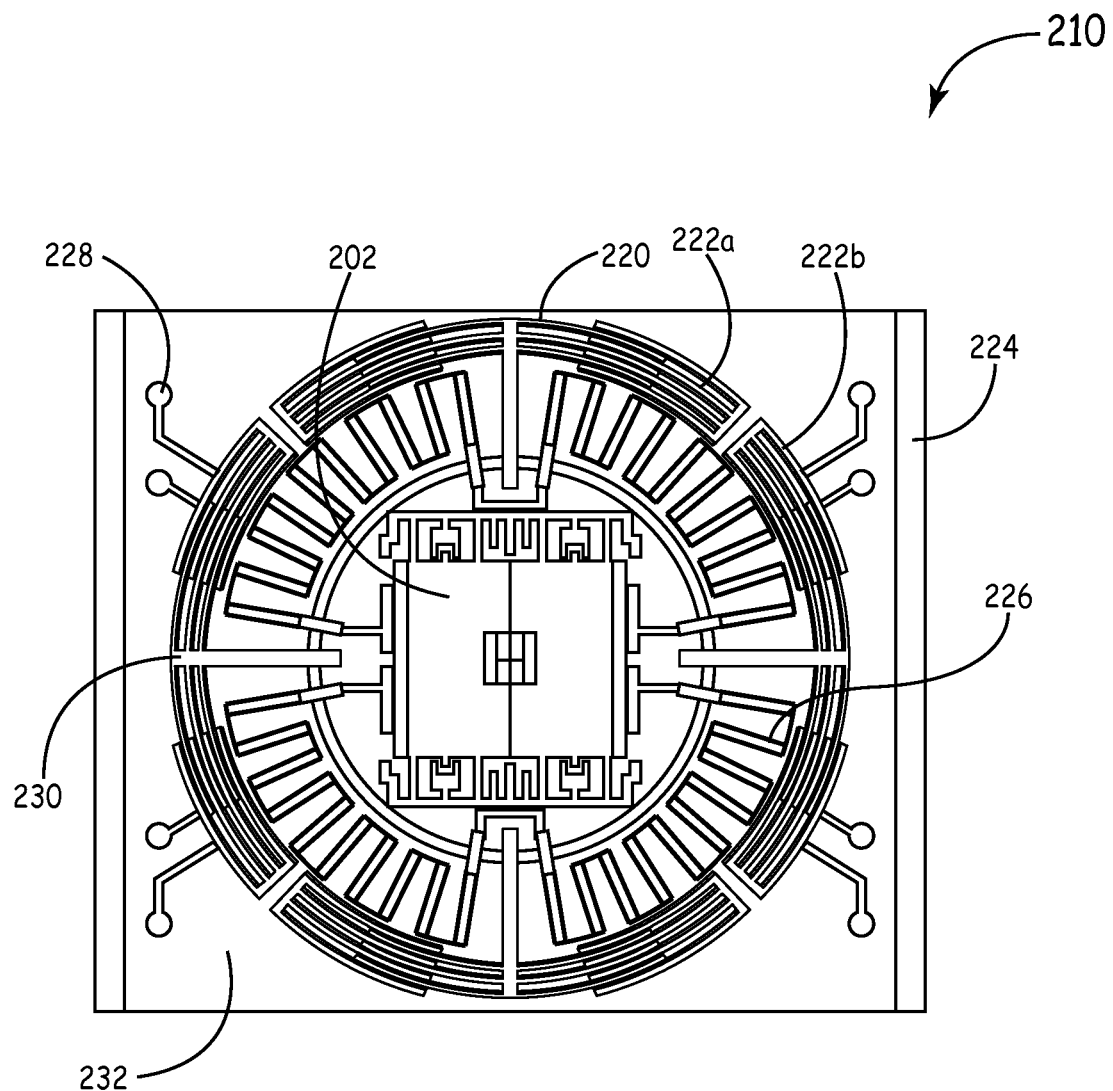
FIG. 2 is an illustration of one embodiment of a MEMS sensor with an in-plane rotator in accordance with the present invention.

FIG. 2 is an illustration of one embodiment of a MEMS sensor layer 210 with an in-plane rotator in accordance with the present invention. MEMS sensor layer 210 includes MEMS sensor 202. MEMS sensor 202 is similar to MEMS sensor 102 in FIG. 1. The in-plane rotator illustrated in FIG. 2 is similar to in-plane rotator 104 and rotates MEMS sensor 202 in the plane of MEMS sensor layer 210. Further, the moving parts of MEMS sensor layer 210 are supported by a supportive substrate 232. Supportive substrate 232 is similar to first rotor layer 108 or second rotor layer 112. Further, control signals for the operation of the in-plane rotator and MEMS sensor 202 are received by the in-plane rotator through traces 228 formed in supportive substrate 232.

In certain embodiments, traces 228 connect to the in-plane rotator and the in-plane rotator conducts signals received over traces 228 to the MEMS sensor 202 and to in-plane drive electrodes 222. In at least one particular exemplary implementation, where MEMS sensor 202 is a gyroscope, the in-plane rotator receives signals through traces 228 and conducts the received signals to gyroscope drive electrodes that cause the proof masses of MEMS sensor 202 to oscillate in response to changing electric fields on the gyroscope drive electrodes. Further, traces 228 also connect to the in-plane rotator to provide electrical signals to the in-plane rotator that controls the in-plane rotation of MEMS sensor 202.

In the present exemplary embodiment, the in-plane rotator is a circular interdigitated comb drive that includes in-plane drive electrodes 222a and 222b, driven electrodes 220, torsional suspension 226, and rotor beam 230. Traces 228 connect to both in-plane drive electrodes 222 and torsional suspension 226. In at least one implementation, the traces 228 that connect to torsional suspension 226 conduct control signals to MEMS sensor 202 as described above. Further, traces 228 that connect to in-plane drive electrodes 222 also direct in-plane drive electrodes 222 to create electric fields that cause driven electrodes 220 to move either away or toward in-plane drive electrodes 222. In at least one implementation, the in-plane drive electrodes 222 and the driven electrodes 220 are placed around MEMS sensor 202 such that in-plane drive electrodes 222 and driven electrodes 220 circularly alternate around MEMS sensor 202. Because in-plane drive electrodes 222 and driven electrodes 220 circularly alternate around MEMS sensor 202, the inducement of electric fields by in-plane drive electrodes 222a and 222b cause driven electrodes 220 to oscillate about an axis that is perpendicular to the plane containing in-plane drive electrodes 222 and extends through MEMS sensor 202. In certain embodiments, in-plane drive electrodes 222a drives the driven electrodes 220 at a different potential than in-plane drive electrodes 222b. For example, in-plane drive electrode 222a and in-plane drive electrode 222b alternatively exert a force on driven electrodes 220. To alternatively exert a force on driven electrodes, a first electrical signal is sent to in-plane drive electrode 222a and a second electrical signal is sent to in-plane drive electrode 222b. The first electrical signal and the second electrical signal are phased such that when in-plane drive electrode 222a is exerting a maximum force on driven electrodes 220, in-plane drive electrode 222b is exerting a minimum force on driven electrodes 220 and vice versa. By alternatingly exerting maximum and minimum forces on driven electrodes 220, in-plane drive electrodes 222a and 222b cause the circular interdigitated comb drive to dither MEMS sensor 202 in the plane of MEMS sensor layer 210. Further, the force exerted by in-plane drive electrodes 222a and 222b on driven electrodes 220 cause the MEMS sensor to oscillatingly dither up to a defined angular distance from a non-oscillating position. In certain implementations, the MEMS sensor is oscillatingly dithered up to 30 degrees from a non-oscillating position. For example, driven electrodes 220 oscillate twelve degrees from a non-oscillating position.

In certain embodiments, driven electrodes 220 attach to a rotor portion of supportive substrate 232 through rotor beams 230. The rotor portion of supportive substrate 232 also attaches to MEMS sensor 202 and is detached from a portion of supportive substrate 232 that attaches to in-plane drive electrodes 222. To support the rotor portion of supportive substrate 232, driven electrodes 220, and MEMS sensor 202, a torsional suspension 226 connects the rotor portion of supportive substrate 232 to the portion of supportive substrate that attaches to in-plane drive electrodes 222. Further, traces 228 connect to torsional suspension 226 to provide an electrical connection to MEMS sensor 202. In some embodiments, torsional suspension 226 includes a series of folded beams that expand and contract as the rotor portion of supportive substrate 232 rotates in response to electric fields on in-plane drive electrodes 222.

Electrical fields induced on in-plane drive electrodes 222 cause driven electrodes 220 to rotate. Driven electrodes are connected to the rotor portion of supportive substrate 232. Thus, the electric fields on in-plane drive electrodes 222 cause the rotor portion of supportive substrate 232 to rotate. Because supportive substrate 232 is connected to MEMS sensor 202, MEMS sensor 202 also rotates in response to the electric fields produced at the in-plane drive electrodes 222. To maintain the rotor portion of supportive substrate 232 in the same plane of in-plane drive electrodes 222, torsional suspension 226 connects the rotor portion of supportive substrate 232 to the portion of supportive substrate 232 that is connected to in-plane drive electrodes 222. Further, when MEMS sensor 202 is a gyroscope, MEMS sensor 202 operates in a vacuum environment. To preserve the vacuum, MEMS sensor layer 210 also includes a hermetic seal 224 around the boundary of MEMS sensor layer 210. When MEMS sensor layer 210 is bonded to other layers, hermetic seal 224 preserves a vacuum environment around the components of MEMS sensor layer 210. Alternatively, hermetic seal 224 also preserves a gaseous environment around the components of MEMS sensor layer 210.

Figure 3:
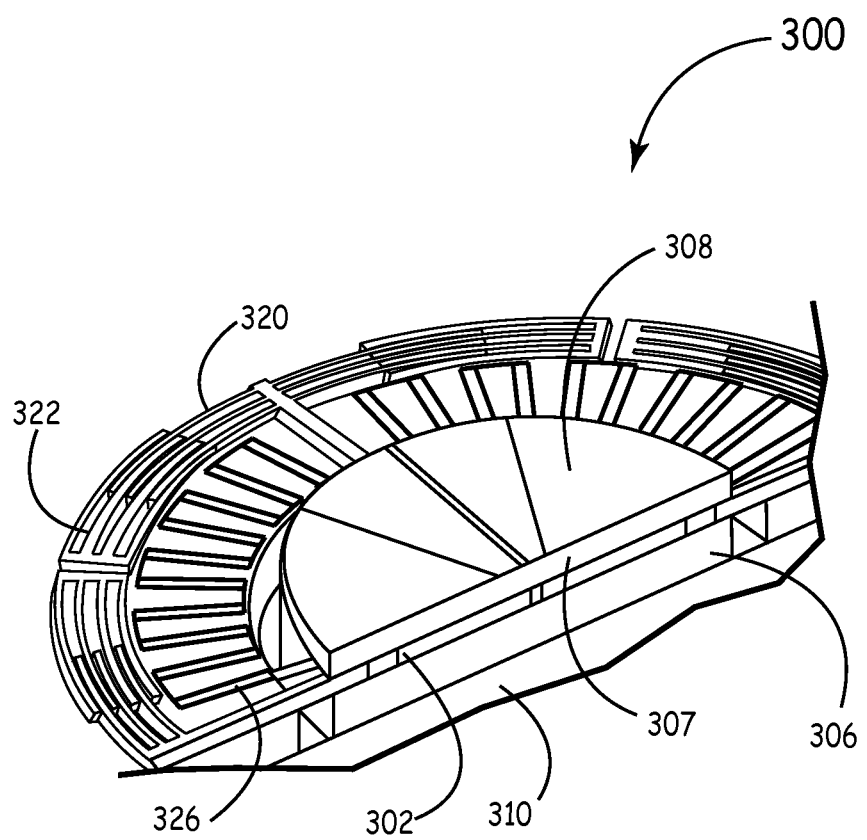
FIG. 3 is a perspective view of one embodiment of a MEMS sensor attached to a rotor with accompanying in-plane and out-of-plane rotator in accordance with the present invention.

FIG. 3 is a perspective view of one embodiment of a MEMS device 300 with accompanying in-plane and out-of-plane rotators. MEMS device 300 includes a MEMS sensor 302, which functions similarly to MEMS sensor 102 in FIG. 1. To correct bias and scale factor drift in MEMS device 300, MEMS sensor 302 is dithered both in the plane of MEMS sensor 302 and out of the plane of MEMS sensor 302. To dither the MEMS sensor 302 in the plane of MEMS sensor 302, MEMS device 300 includes in-plane driven electrodes 320, in-plane drive electrodes 322, and torsional suspension 326. In-plane driven electrodes 320 function similarly to driven electrodes 220 in FIG. 2, in-plane drive electrodes 322 function similarly to in-plane drive electrodes 222 in FIG. 2, and torsional suspension 326 functions similarly to torsional suspension 226 in FIG. 2. As described above, in-plane driven electrodes 320 connect to a rotor portion of a supportive substrate.

In certain embodiments, the supportive substrate includes two layers that encapsulate the MEMS device. For example, a first rotor layer 306 and a second rotor layer 307 encapsulate a MEMS sensor layer and MEMS sensor 302. First rotor layer 306 includes a rotor portion and a non-rotor portion. In certain implementations, the non-rotor portion attaches to in-plane drive electrodes 322 and torsional suspension 326. The rotor portion of first rotor layer 306 also connects to torsional suspension 326 while also connecting to in-plane driven electrodes 320 and MEMS sensor 302. Second rotor layer 307 is similar to first rotor layer 306 and connects to the same components of the MEMS sensor layer. When in-plane drive electrodes 322 cause MEMS sensor 302 to oscillate, the rotor portions of first rotor layer 306 and second rotor layer 307 also oscillate as described above.

In a further embodiment, the rotor portions of first rotor layer 306 and second rotor layer 307 oscillate out of the plane of the MEMS sensor layer. In one exemplary embodiment, second rotor layer 307 includes out-of-plane driven electrodes 308 formed on the outside surface of the rotor portion of second rotor layer 307. First rotor layer 306 also has out-of-plane driven electrodes that are similar to out-of-plane driven electrodes 308. To drive out-of-plane driven electrodes, an out-of-plane driving layer 310 includes driving electrodes that create electric fields that are incident on out-of-plane driven electrodes 308. The electric fields cause the rotor portions of first rotor layer 306 and second rotor layer 307 to oscillate out of the plane of the MEMS sensor layer. In one implementation, the rotor portions of first rotor layer 306 and second rotor layer 307 oscillate less than 1 degree out-of-plane from the non-oscillating position.

Figure 4:
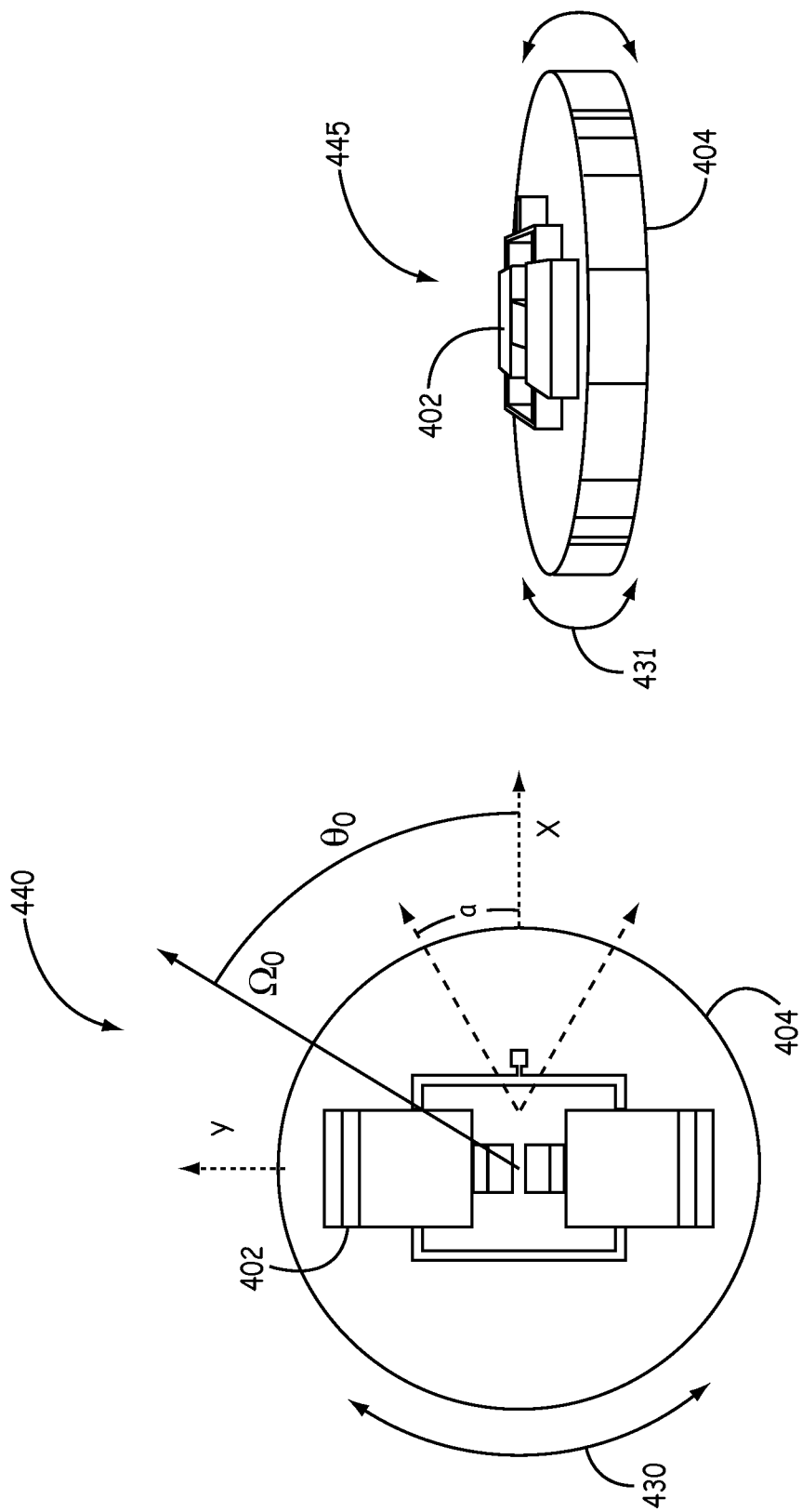
FIG. 4 is an illustration of one embodiment of a top view and side view of a MEMS sensor attached to a rotor that is dithered through two degrees of freedom in accordance with the present invention.

FIG. 4 is an illustration of one embodiment of a top view 440 and side view 445 of a MEMS sensor 402 attached to a rotor 404 that is dithered through two degrees of freedom in accordance with the present invention. Top view 440 illustrates the in-plane dithering 430 of MEMS sensor 402 and rotor 404. In-plane dithering 430 corrects the bias drift for measurements from a MEMS sensor.

In-plane dithering 430 mechanically modulates the input axis of MEMS sensor 402 about an axis orthogonal to the input axis. The input axis of MEMS sensor 402 is rotated through an angle of $2\alpha$. The non-oscillating rest position of the gyro input axis is oriented at an angle of $\theta_0$ with respect to the axis of rotation for the MEMS sensing device 100 in FIG. 1, where the axis of rotation for MEMS sensing device 100 has a magnitude of $\Omega_0$ that is measured by the sensor. When MEMS sensor 402 is dithered at frequency $\omega$, the input rotation sensed by MEMS sensor 402 can be written as:

$$\omega_M = \Omega_0 \cos(\theta_0 + \alpha \sin \omega t) + B(t)$$

where $\Omega_0$ is the magnitude of rotation for MEMS sensing device 100, $\theta_0$ is the angle between the gyro input axis and the rotation axis for MEMS sensing device 100, $\alpha$ is the modulation amplitude, and $B(t)$ is a time varying sensor bias. This equation can be rewritten as:

$$\Omega_M = \Omega_0 \cos\theta_0 \cos(\alpha \sin \omega t) - \Omega_0 \sin\theta_0 \sin(\alpha \sin \omega t) + B(t).$$

Expanding the cos and sin terms yields:

$$\Omega_M = \Omega_0 \cos\theta_0 \left(1 - \frac{a^2 \sin^2 \omega t}{2} + \frac{a^4 \sin^4 \omega t}{4!} - \ldots\right) - \Omega_0 \sin\theta_0 \left(a\sin\omega t - \frac{a^3 \sin^3 \omega t}{6} + \frac{a^5 \sin^5 \omega t}{5!} - \ldots\right) + B(t).$$

Modulating the rotation signal with the dither signal, produces the following:

$$\Omega_{MOD} = \Omega_0 \cos\theta_0 \left(1 - \frac{a^2 \sin^2 \omega t}{2} + \frac{a^4 \sin^4 \omega t}{4!} - \ldots\right)\sin\omega t - \Omega_0 \sin\theta_0 \left(a\sin\omega t - \frac{a^3 \sin^3 \omega t}{6} + \frac{a^5 \sin^5 \omega t}{5!} - \ldots\right)\sin\omega t + B(t)\sin\omega t$$

The time varying bias is now modulated by w, removing higher frequency terms results in the following equation:

$$\Omega_M = -\Omega_0 \sin\theta_0 \left(\frac{1}{2}a - \frac{1}{16}a^3 + \frac{1}{384}a^5 - \ldots\right).$$

Therefore, mechanically modulating the sensor input allows the bias signal to be eliminated from the true rotation signal. Further, mechanically modulating the sensor input also changes the input axis for the MEMS sensing device containing dithered MEMS sensor 402. In one embodiment, the input axis for the MEMS sensing device 100 in FIG. 1 is orthogonal to the input axis for the MEMS sensor 402 while being in the same plane as MEMS sensor 402.

Further, the following equations illustrate how the frequency of the coriolis force is affected by in-plane dithering 430. In explaining the following equations the following variables are used:
  A=motor amplitude
  $\omega_m$=gyro motor frequency
  $\omega_d$=platform dither
  $F_c$=coriolis force
  m=proof mass mass
  v=velocity of proof mass
  $\Omega$=rotation
  $\theta$=Angle between motor axis and rotation axis.
The equations are as follows:

$$F_c = -2m\hat{\Omega} \times \hat{v}$$

$$\hat{\Omega} = \Omega \hat{y}$$

The velocity of proof masses in MEMS sensor 402 have components in x and y axes depending on angle $\theta$. This is the dither angle and is a time varying component of $\cos(\omega_d t)$.

$$\hat{v} = A\omega_m \cos \omega_m t \cdot \{\cos[\theta \cos(\omega_d t)]\hat{x} + \sin[\theta \cos(\omega_d t)]\hat{y}\}$$

$$F_c = -2mA\Omega\omega_m \cos \omega_m t \cdot \sin[\theta \cos(\omega_d t)]$$

for small $\theta$:

$$F_c = -2mA\Omega\omega_m \cos \omega_m t \cdot [\theta \cos(\omega_d t) + \text{other terms}]$$

$$F_c = -mA\Omega\omega_m \theta[\cos(\omega_m + \omega_d) + \cos(\omega_m - \omega_d)]$$

Coriolis force is generated at $\omega_m +/- \omega_d$.

Also, side view 445 illustrates the out-of-plane dithering 431 of MEMS sensor 402 and rotor 404. Out-of-plane dithering 431 corrects the scale factor drift for measurements from MEMS sensor 402. To correct for scale factor drift, $\Omega_M$, from the equation $$\Omega_M = -\Omega_0 \sin\theta_0 \left(\frac{1}{2}a - \frac{1}{16}a^3 + \frac{1}{384}a^5 - \ldots\right)$$

shown above, is measured by converting the coriolis force caused by the magnitude of rotation $\Omega_0$. To measure the scale factor, the magnitude of rotations must be known and the resulting signal from the MEMS sensing device is measured. The combination of the magnitude of rotation and output signal allow the scale factor to be measured.

Figure 5:
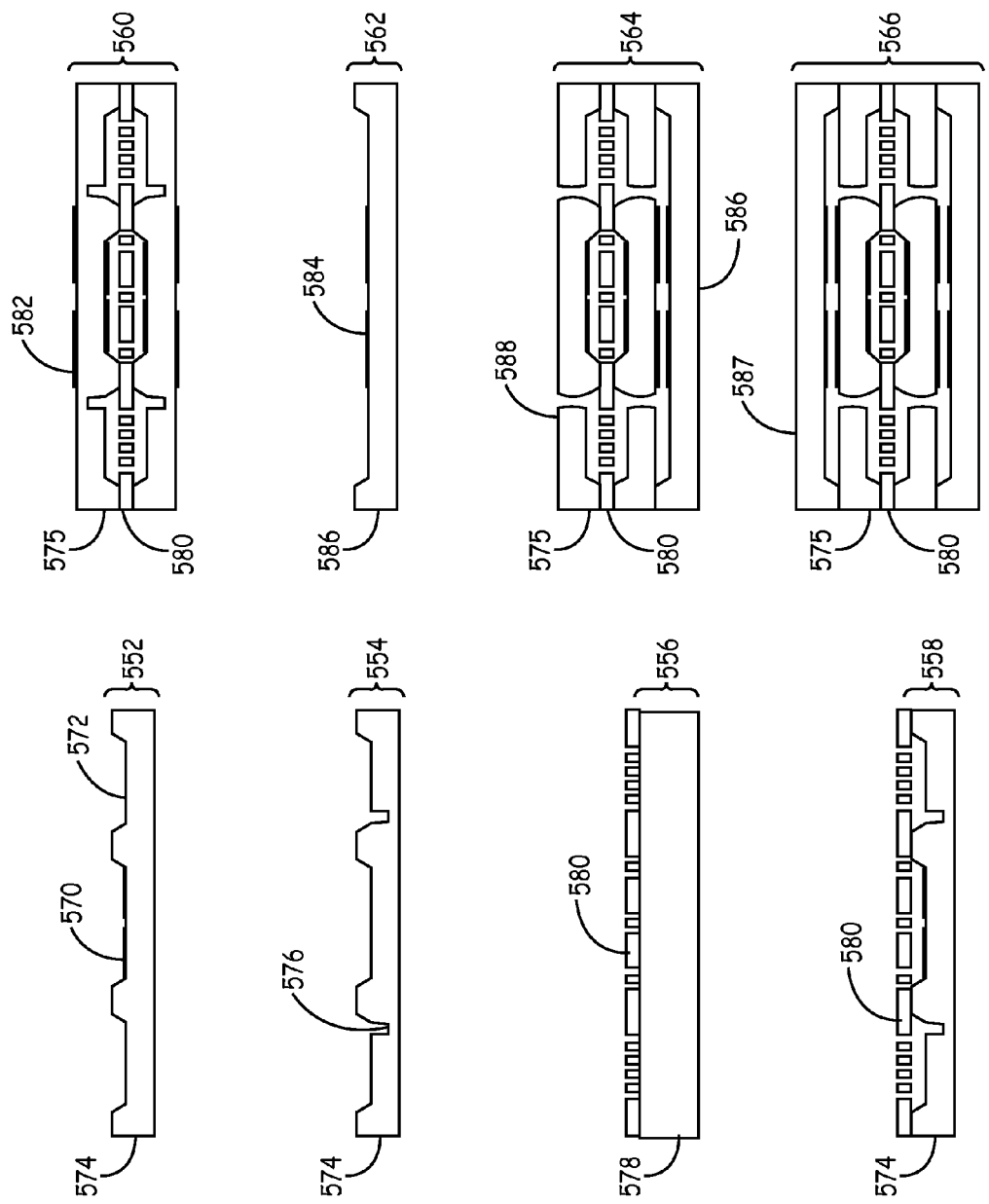
FIG. 5 is an illustration of one embodiment of a fabrication process of a MEMS sensor attached to a two degree of freedom dithering platform in accordance with the present invention.

FIG. 5 is an illustration of one embodiment of a fabrication process of a MEMS sensor attached to a two degree of freedom dithering. To form the MEMS sensor, a rotor layer 574 is formed (shown at 552). When rotor layer 574 is formed, recesses 572 are formed in an insulative layer such as glass. For example, when rotor layer is made from insulative glass, recesses 572 are formed in locations that would allow for the free motion of MEMS devices that are in contact with rotor layer 574. When the recesses 572 are formed, traces 570 are formed on the rotor layer that will provide electrical connections to the MEMS device. Also, the locations on rotor layer 574 that are not recessed are used for connecting to a layer containing a MEMS device. Further, rotor layer is prepared for dithering by partially separating a rotor portion from rotor layer (shown at 554). To partially separate the rotor portion, trenches 576 are formed around the boundaries of a rotor portion of rotor layer 574. For example, a small circle is partially etched around a rotor portion of rotor layer 574. In some implementations, the rotor portion is not entirely separated from rotor layer 574 to furnish a rigid support structure during the bonding of flexible MEMS structures to rotor layer 574.

In certain embodiments, the fabrication process continues by forming MEMS device layer 580 (shown at 556). In at least one exemplary implementation, MEMS device layer 580 is formed in an epitaxial layer supported by a semiconductor substrate 578. For example, a pattern is formed in an epitaxial layer that corresponds with the shape of components in MEMS device layer 580. The epitaxial layer is then etched to form MEMS device layer 580 supported by semiconductor substrate 578.

When MEMS device layer 580 is formed in the epitaxial layer, MEMS device layer 580 is bonded to a first rotor layer 574, which is formed as described above (shown at 558). In at least one exemplary embodiment, to bond MEMS device layer 580 to first rotor layer 574, the MEMS device layer 580 in the epitaxial layer is flipped and anodically bonded to first rotor layer 574. When MEMS device layer 580 is bonded to first rotor layer 574, the semiconductor substrate 578 is removed from the epitaxial layer to free the MEMS device layer 580 such that MEMS devices in MEMS device layer 580 are able to move. In one particular example, a portion of MEMS device layer 580 is bonded to the non-rotor portion of first rotor layer 574, while a different portion of MEMS device layer 580 is bonded to the rotor portion of first rotor layer 574. When the first rotor layer 574 is bonded to MEMS device layer 580, a second rotor layer 575 is bonded to the other side of MEMS device layer 580 in the same way that first rotor layer 574 was bonded to MEMS device layer 580 (shown at 560). Further, when both first rotor layer 574 and second rotor layer 575 are bonded to MEMS device layer 580, out-of-plane driven electrodes 582 are formed on the outside surface of the rotor portions of first rotor layer 574 and second rotor layer 575.

Further, to control the out-of-plane dithering, an out-of-plane drive layer 586 is formed (shown at 562). To form out-of-plane drive layer 586, out-of-plane driving electrodes 584 are placed on the inside surface of out-of-plane drive layer 586. The out-of-plane driving electrodes 584 produce electric fields that cause out-of-plane driven electrodes to dither in and out of the plane containing MEMS device layer 580.

When a first out-of-plane drive layer 586 is formed, the rotor portion of first rotor layer 574 is fully separated from the non-rotor portion of first rotor layer 574. To fully separate the rotor portion from the non-rotor portion, the trench 576 that was formed in first rotor layer 574 is etched entirely through first rotor layer 574. When the rotor portion is separated from the non-rotor portion, out-of-plane drive layer 586 is anodically bonded to first rotor layer 574 (shown at 564). When, out-of-plane drive layer 586 is bonded to first rotor layer 574, the rotor portion of second rotor layer 575 is fully separated from the non-rotor portion of second rotor layer 575 by extending trench 588 through second rotor layer 575. When the rotor portion of second rotor layer 575 is separated from the non-rotor portion of second rotor layer 575. A second out-of-plane drive layer 587 is bonded to second rotor layer 575. In some embodiments, second out-of-plane drive layer 587 is bonded to second rotor layer 575 in a vacuum environment to seal a vacuum environment within the MEMS sensing device. Alternatively, second out-of-plane drive layer 587 is bonded to second rotor layer in a gaseous environment to seal a gaseous environment within the MEMS sensing device.

Figure 6:
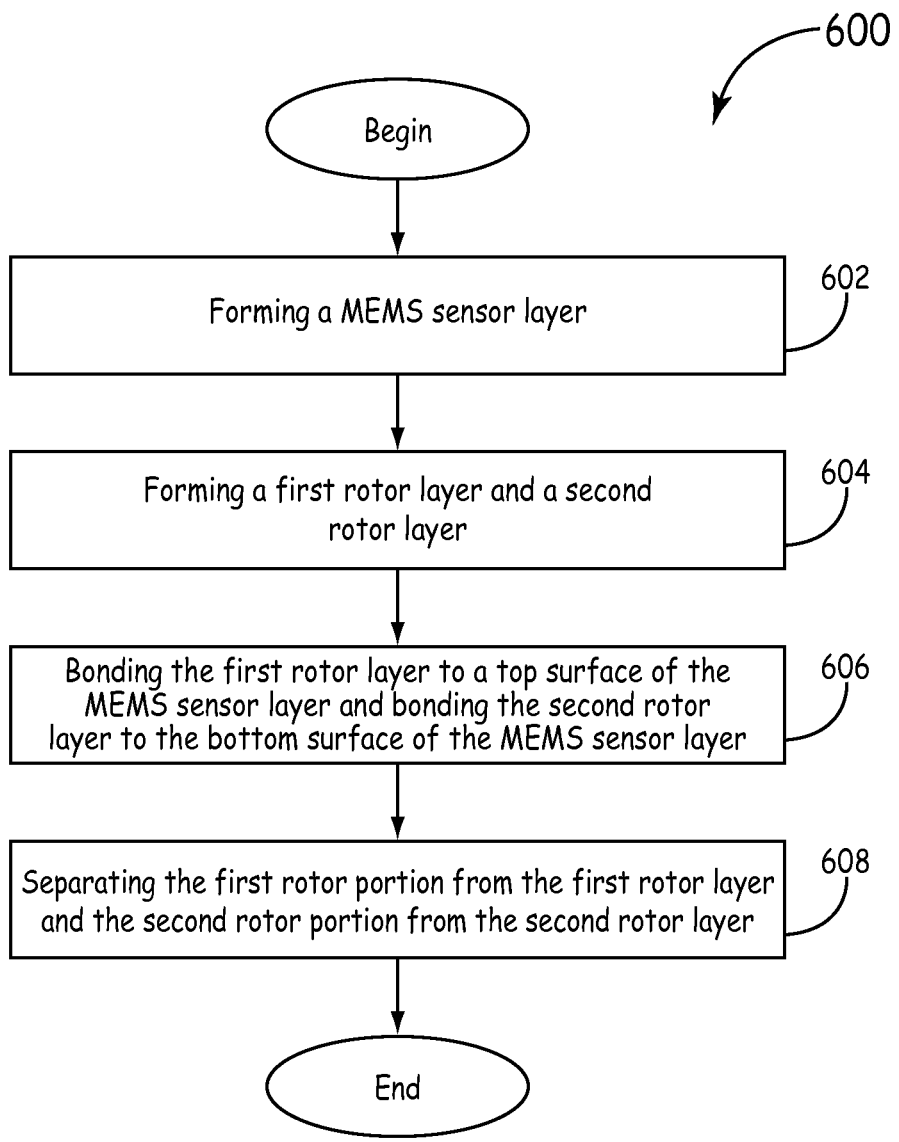
FIG. 6 is a flow chart diagram of one embodiment of a method for fabricating a MEMS sensor that is attached to a two degree of freedom dithering platform in accordance with the present invention.

FIG. 6 is a flow chart diagram of one embodiment of a method 600 for fabricating a MEMS sensor that is attached to a two degree of freedom dithering platform Method 600 begins at 602 where a MEMS sensor layer is formed. In certain embodiments, when a MEMS sensor layer is formed, the MEMS sensor layer includes a MEMS sensor that senses rotation about an input axis; and an in-plane rotator that rotates the MEMS sensor in the plane of the MEMS sensor layer. Method 600 proceeds at 604 where a first rotor layer and a second rotor layer are formed.

When the first rotor layer and the second rotor layer are formed, method 600 proceeds at 606 where the first rotor layer is bonded to a top surface of the MEMS sensor layer and the second rotor layer is bonded to the bottom surface of the MEMS sensor layer. In at least one implementation, the first rotor layer includes a first rotor portion that is connected to the MEMS sensor. Further, the second rotor layer includes a second rotor portion that is also connected to the MEMS sensor.

In further embodiments, method 600 proceeds at 608 where the first rotor portion is separated from the first rotor layer and the second rotor portion is separated from the second rotor layer. In at least one implementation, when the first rotor portion and the second rotor portion are separated from their respective rotor layers, the first rotor portion, MEMS sensor, and second rotor portion rotate about an axis in the plane of MEMS sensor layer. For example, first rotor portion and second rotor portion include out-of-plane driven electrodes that respond to electric fields that cause the first rotor potion, MEMS sensor, and second rotor portion to oscillate about the axis in the plane of MEMS sensor layer. Thus, the MEMS sensor is oscillating about two orthogonal axes, which allows for the correction of bias and scale factor drift.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A micro-electromechanical system (MEMS) sensing device, the device comprising:
   a MEMS sensor formed in a plane of a MEMS sensor layer; and
   at least one rotator configured to dither the MEMS sensor, wherein dithering the MEMS sensor is performed in the plane of the MEMS sensor layer and about an axis in the plane of the MEMS sensor layer, wherein the at least one rotator comprises:
      a first rotor layer, the first rotor layer comprising a first rotor portion connected to the MEMS sensor, wherein the first rotor portion rotates about the axis in the plane of the MEMS sensor layer; and
      a second rotor layer, the second rotor layer comprising a second rotor portion connected to the MEMS sensor, wherein the second rotor portion rotates about the axis in the plane of the MEMS sensor layer.

2. The MEMS sensing device of claim 1, wherein the MEMS sensor is at least one of:
   a gyroscope; or
   an accelerometer.

3. The MEMS sensing device of claim 1, wherein the at least one rotator comprises a circular interdigitated comb drive configured to rotationally oscillate the MEMS sensor in the plane of the MEMS sensor layer, the at least one rotator being formed in the MEMS sensor layer.

4. The MEMS sensing device of claim 3, wherein the circular interdigitated comb drive rotationally oscillates the MEMS sensor a defined angular distance from a non-oscillating position.

5. The MEMS sensing device of claim 3, wherein the circular interdigitated comb drive comprises:
   a plurality of in-plane driving electrodes; and
   a plurality of in-plane driven electrodes, wherein the plurality of in-plane driven electrodes and plurality of in-plane driving electrodes are circularly arranged around the MEMS sensor, wherein the plurality of in-plane driven electrodes move in response to electric fields produced by the in-plane driving electrodes.

6. The MEMS sensing device of claim 1, wherein the first rotor layer and the second rotor layer comprise out-of-plane driven electrodes that respond to electrical fields such that the first rotor portion, the second rotor portion and the MEMS sensor oscillate about an axis in the plane of the MEMS sensor layer.

7. The MEMS sensing device of claim 6, wherein the out-of-plane driven electrodes oscillate the MEMS sensor a defined angular distance from a non-oscillating position.

8. The MEMS sensing device of claim 6, further comprising out-of-plane driving electrodes to provide the electrical fields.

9. The MEMS sensing device of claim 1, wherein the first rotor layer and the second rotor layer are supported by a connection between the at least one rotator and the MEMS sensor.

10. The MEMS sensing device of claim 1, wherein the first rotor layer and the second rotor layer comprise traces that electrically connect to the at least one rotator and the MEMS sensor.

11. A micro-electromechanical system (MEMS) gyroscope, the MEMS gyroscope comprising:
   a MEMS gyroscope layer, the MEMS gyroscope layer comprising:
      a MEMS sensor; and
      a first in-plane rotator configured to rotate the MEMS sensor in the plane of the MEMS gyroscope layer;
   a first rotor layer bonded to the MEMS gyroscope layer, the first rotor layer comprising a first rotor portion connected to the MEMS sensor; and
   a second rotor layer bonded to the MEMS gyroscope layer, the second rotor layer comprising a second rotor portion connected to the MEMS sensor, wherein the first rotor portion, the second rotor portion, and the MEMS sensor rotate about an axis in the plane of the MEMS gyroscope layer.

12. The MEMS gyroscope of claim 11, wherein the first in-plane rotator is a circular interdigitated comb drive.

* * * * *